(12) United States Patent
Sudjian

(10) Patent No.: US 7,409,027 B1
(45) Date of Patent: Aug. 5, 2008

(54) SYSTEM AND METHOD FOR RECOVERING A CLOCK USING A REDUCED RATE LINEAR PHASE DETECTOR AND VOLTAGE CONTROLLED OSCILLATOR

(75) Inventor: Douglas Sudjian, Santa Clara, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 81 days.

(21) Appl. No.: 11/279,927

(22) Filed: Apr. 17, 2006

Related U.S. Application Data

(62) Division of application No. 10/172,478, filed on Jun. 14, 2002, now abandoned.

(51) Int. Cl.
  *H03D 3/24* (2006.01)
(52) U.S. Cl. .................. 375/374; 375/376; 327/148
(58) Field of Classification Search ................. 375/374, 375/376; 327/148, 150, 159, 157
See application file for complete search history.

(56) References Cited

U.S. PATENT DOCUMENTS

| | | | |
|---|---|---|---|
| 4,055,814 A | | 10/1977 | Abraham et al. |
| 4,535,459 A | | 8/1985 | Hogge, Jr. |
| 4,975,660 A | * | 12/1990 | Svenson ............ 331/1 A |
| 5,027,085 A | | 6/1991 | DeVito |
| 5,550,515 A | | 8/1996 | Liang et al. |
| 5,712,580 A | * | 1/1998 | Baumgartner et al. ......... 327/12 |
| 5,799,048 A | * | 8/1998 | Farjad-Rad et al. ......... 375/360 |
| 6,002,273 A | * | 12/1999 | Humphreys ............. 327/3 |
| 6,054,903 A | | 4/2000 | Fiedler |
| 6,225,831 B1 | * | 5/2001 | Dalmia et al. ................. 327/12 |
| 6,278,333 B1 | | 8/2001 | Le et al. |

(Continued)

OTHER PUBLICATIONS

Lee et al., "A 155-MHz Clock Recovery Delay- and Phase-Locked Loop," IEEE Journal of Solid-State Circuits, vol. 12, No. 12, Dec. 1992, pp. 1736-1743.

(Continued)

*Primary Examiner*—Temesghen Ghebretinsae
(74) *Attorney, Agent, or Firm*—Kevin L. Daffer; Daffer McDaniel, LLP

(57) ABSTRACT

An improved clock recovery system, phase-locked loop, and phase detector are provided as well as a method for generating charge pump signals. The clock recovery system includes a phase-locked loop. The phase-locked loop includes a phase detector and a voltage-controlled oscillator. The phase detector generates pump signals that change linearly with respect to differences between phases of an incoming signal and a clocking signal. The oscillator is coupled to receive the pump signals and produce a clocking signal at a frequency not exceeding the frequency of the incoming signal. For example, the oscillator can produce clocking signals at one-half the frequency of the incoming signal, where the incoming signal is preferably a maximum bit rate of a data signal from which the clock signal is recovered. The phase detector can include a first flip-flop and second flip-flop. The first flip-flop receives the incoming signal and a differential first pair of clocking signals, whereas the second flip-flop is coupled to receive a delayed incoming signal and a differential second pair of clocking signals. The differential second pair of clocking signals are delayed 90° from the first pair of clocking signals to present a phase detector that samples using a quadrature clocking signal generated from the oscillator.

10 Claims, 5 Drawing Sheets

U.S. PATENT DOCUMENTS

| | | |
|---|---|---|
| 6,700,944 B1 | 3/2004 | Chlipala et al. |
| 6,771,728 B1 * | 8/2004 | Abernathy .................. 375/371 |
| 7,057,418 B1 * | 6/2006 | Fu et al. ........................ 327/3 |
| 2002/0084815 A1 * | 7/2002 | Murphy et al. .............. 327/157 |
| 2006/0192594 A1 * | 8/2006 | Sanduleanu .................. 327/47 |

OTHER PUBLICATIONS

Hogge JR., "A Self Correcting Clock Recovery Circuit," IEEE Journal of Lightwave Technology, vol. LT-3, Dec. 1985, pp. 1312-1314.

* cited by examiner

SYSTEM AND METHOD FOR RECOVERING A CLOCK USING A REDUCED RATE LINEAR PHASE DETECTOR AND VOLTAGE CONTROLLED OSCILLATOR

CONTINUING DATA

This application is a divisional application of U.S. Ser. No. 10/172,478 filed Jun. 14, 2002.

BACKGROUND OF THE INVENTION

1. Field of the Invention

This invention relates to a clock recovery circuit and, more particularly, to a phase-locked loop ("PLL") circuit having a linear phase detector and voltage controlled oscillator that will sample received data patterns at a reduced clock rate.

2. Description of the Related Art

The following descriptions and examples are not admitted to be prior art by virtue of their inclusion within this section.

Modern high-speed data communication systems typically use internal clock-referenced circuitry. The circuitry is designed to synchronize with, for example, an incoming data stream or reference signal. In most instances, a PLL circuit is used to derive a clock from an incoming data stream and provide that clock for use by clock-referenced circuitry.

In its most basic form, a PLL consists of a phase/frequency detector, a filter, control circuitry, and a variable oscillator. In a clock recovery application, output from the oscillator constitutes a recovered clocking signal whose frequency and phase are compared against an incoming data stream. Thus, the clocking signal preferably oscillates at a rate based upon sampling edge transitions of an incoming data stream. Once compared, the control circuitry adjusts the oscillator output frequency so that the incoming data stream and the oscillator output are transitioning at, ideally, the same frequency and phase with one another.

A substantial amount of work with PLLs involves the design and implementation of the phase detectors. There are two types of phase detectors: linear and non-linear. FIG. 1 illustrates gain characteristics of a non-linear phase detector 10 and a linear phase detector 12. As shown, a linear phase detector 12 will exhibit gain characteristics that are proportional to the phase error between the oscillator output and the incoming data stream. As the input phase error difference increases or decreases, the linear phase detector that drives a charge pump will exhibit an average output current or voltage that will also increase or decrease linearly. The linear relationship between the relative pump up and pump down outputs from the phase detector are based upon the linear phase differences at the inputs that can generally be used to generate average error correction signals within the PLL. The linear phase detector charge pump gain is based upon a mathematical model that can predict fairly well the average output error signal generated based upon the relative input phase differences between two clock signals within a negative and a positive range in time. In other words, for each point in which the feedback-clocking signal lags or leads the incoming data stream, a prediction can be easily made through modeling on what will be the appropriate pump up and pump down duty cycles. These error signals can be used to generate currents or voltages that in turn control the oscillator sampling clock.

Conversely, non-linear phase detectors theoretically have an infinite gain at the phase-lock point and this gain is somewhat non-deterministic around the phase-lock point and is typically hard to guarantee. Obtaining mathematical descriptions and models, other than rough approximations, that describe a non-linear loop dynamic are rarely published and difficult to obtain. In this scenario, the actual PLL design process can become one of a very empirical nature. As shown in the non-linear example 10, slight changes in phase differences of the incoming clock feedback signals from a lock point will either drive the pump up/pump down ratio fully in the positive direction or fully in the negative direction. Thus, certain types of non-linear phase detectors are referred to as a "bang-bang" or "early-late" phase detectors. In a bang-bang phase detector, slight error differences at the inputs to the phase detector will drive the phase detector outputs to rail (i.e., "bang") and will make no distinction between small or large input errors and phase differences. The large gain, and its variation over process, can unfortunately lead to PLL performance degradation. For example, in a SONET receiver application, these non-linear phase detector gain variations can change PLL bandwidth parameters that can ultimately lead to jitter peaking. This relative instability can skew over time with different data patterns along with semiconductor fabrication processing and operating temperature variations.

It would be advantageous to be able to easily produce a linear phase detector if it is deemed important to predict output for small perturbations of phase error or phase differences on the detector input. However, other forms of linear phase detectors can require a feedback-clocking signal that transitions at twice the frequency as the maximum input data stream. SONET bit streams can have a bit rate exceeding 10 Gbit/sec or even 40 Gbit/sec (e.g., SONET/SDH Standard OC-192 specifies a transmission rate of 9953.28 Mbit/sec, and OC-768 specifies a transmission rate of 39813.12 Mbit/sec). Consequently, at the modern data transmission rates, deriving a voltage-controlled oscillator to transition at twice the incoming bit stream frequency is difficult. For example, a 40 Gbit/sec SONET data stream would require a 40 GHz voltage-controlled oscillator output, which is very hard to achieve with most current fabrication techniques.

Examples of linear phase detectors that require a feedback clocking signal at twice the maximum incoming data frequency are set forth in Hogge, "A Self Correcting Clock Recovery Circuit," IEEE Jr. of Lightwave Technology, Vol. LT-3, December 1985; and, Lee, "A 155-MHz Clock Recovery Delay and Phase-Locked Loop," IEEE Jr. of Solid-State Circuits, Vol. 27, No. 12, December 1992. The Hogge and Lee references describe the benefits of using linear phase detectors in a clock recovery application. Yet, however, in both references, a feedback-clocking signal is shown that transitions at twice the incoming maximum data rate frequency.

An unfortunate outcome of requiring a high-speed voltage-controlled oscillator output is not only the difficulty in designing and maintaining a high frequency VCO, but also the challenges presented in maintaining a linear response at high data rates. FIG. 2 illustrates a series of timing diagrams 14 from a phase detector whose output varies depending on the data rate input. More specifically, diagrams 14 indicate analog outputs that switch levels in a slew-rate limited manner based upon bandwidth limitations of the circuit operating frequency. The outputs integrate upward as the phase detector output goes positive and integrate downward as the phase detector output goes negative. The phase detector average output is, therefore, shown in its integrated form as having a sawtooth shape. As the data rate transition density increases (i.e., the number of 1s and 0s increases per second), the overall phase detector can exhibit a net decrease in gain due to this apparent pulse sliming and amplitude limiting consequence.

Waveforms 14 also illustrate additional non-linear pulse slimming attributed to phase offsets between the data and clock at a high data rate transfer density. As shown in waveform 14, an isolated error pulse is examined about the ideal lock-in point (zero phase error) and is identified as pulse 16b. The sampled phase error between data and clock can ultimately change where the leading edge of pulse 16 starts to transition from a low to high state, as shown by the variation of the nominal pulse width 16b increasing to 16a or decreasing to 16c. These effects will contribute to an asymmetric pulse width due to the signals switching in a slew-rate limit condition. Thus, pulses 16 further illustrate the phase detector gain limitations due to phase error pulse sliming that are attributed to pulse amplitude variation due to the varying phase error between data and clock at high data densities.

The effect upon the linear range and the overall linearity of the phase detector output, whenever gain characteristics change based on data dependency, is shown in graph 18. The output error pulse width and amplitude of the pulse of the pump up or pump down signal changes with the data input phase difference. Small phase differences tend to diminish the error pulse. If the error signals need to drive a charge pump, then this translates to loss of phase detector/charge pump gain, or no gain whatsoever. Linear range and phase detector gain over process variations will therefore be grossly effected. The results might be seen as induced PLL output clock jitter relative to the input data due to loss of gain. In another instance, a static phase offset of the data-sampling clock within the phase detector output can appear due to the lack of the phase detector being able to maintain adequate linear gain, thus contributing to bit-error rate degradation.

It would be desirable to introduce a clock recovery system that uses a PLL having a linear phase detector. It would also be desirable to derive a linear phase detector that does not require a feedback-clocking signal that transitions at twice the maximum frequency of the incoming data stream. An improved PLL with a phase detector operating at a relaxed sampling rate from a voltage-controlled oscillator would thereby extend the maximum operating frequency while avoiding the data dependent gain and jitter problems attributed to conventional linear phase detectors.

SUMMARY OF THE INVENTION

The problems outlined above are in large part solved by an improved clock recovery system and, more particularly, a PLL architecture that uses a linear phase detector absent the need to operate the phase detector and voltage-controlled oscillator at twice the maximum frequency of the incoming data stream. The PLL thereby generates pump signals that change linearly with respect to differences between phases of an incoming signal and a clocking signal. The voltage-controlled oscillator is controlled by an error signal as a consequence of filtering the charge pump signals, and produces a clocking signal at a frequency not exceeding that of the incoming signal. The charge pump signals can be a pump up signal and a pump down signal, wherein the pump up signal may be a differential pair of pump signals and the pump down signal may be a differential pair of pump down signals. The pump signals can change linearly from phase differences between approximately −90° and +90° or, more preferably, between approximately −180° and +180°. The feedback-clocking signal is preferably sustained substantially at the frequency of the incoming signal (i.e., the incoming data stream transitioning at its maximum rate).

The phase detector preferably includes a first flip-flop and a second flip-flop. The first flip-flop is coupled to receive an incoming signal and a first clocking signal. The incoming signal can be a differential pair of data signals and the clocking signal can be a differential first pair of clocking signals. The second flip-flop is coupled to receive a delayed incoming signal and a second clocking signal, wherein the second clocking signal can be a second pair of clocking signals delayed 90° from the first pair of clocking signals. Thus, the second flip-flop can have an input that is coupled to the output of the first flip-flop, taking into account the delay of the first flip-flop to produce the delayed incoming signal for the second flip-flop. A first and second pair of logic gates are coupled to respective incoming and outgoing signals that are fed into and out of the respective first and second flip-flops. The first logic gate can produce a pump up signal, and the second logic gate can produce a pump down signal. The pump down signal is preferably fixed at a duty cycle of 50%, yet the pump up signal is maintained at a duty cycle that varies linearly with differences between phases of the incoming signal and the first pair of clocking signals.

According to yet another embodiment, a method is provided for producing charge pump signals. The method includes sampling rising and falling edges of an incoming signal using a quadrature pair of clocking signals. As used herein, a quadrature clocking signal is a signal that has transitions at 90° offset from one another. Therefore, the quadrature 90° phase offsets formulate a 360° clocking reference, alternatively known as a quadrature clocking reference or signal. The method further includes generating a pump up signal having a duty cycle that changes linearly with phase differences between the incoming signal and the clocking signal. A pump down signal is also generated having a duty cycle that does not change linearly with phase differences between the incoming signal and the clocking signal.

The pair of quadrature clocking signals sample the incoming signal with a first pair of differential clocking signals and sample a delayed incoming signal with a second pair of differential clocking signals. The second pair of differential quadrature clocking signals are delayed by 90° from the first pair of differential clocking signals. The amount by which the voltage-controlled oscillator is pumped up (or pumped down) depends on the amount by which the variable input phase difference exceeds (or is less than) the fixed phase difference established by the constant pump down signal.

BRIEF DESCRIPTION OF THE DRAWINGS

Other objects and advantages of the invention will become apparent upon reading the following detailed description and upon reference to the accompanying drawings in which.

DETAILED DESCRIPTION OF PREFERRED EMBODIMENTS

Figure 1:
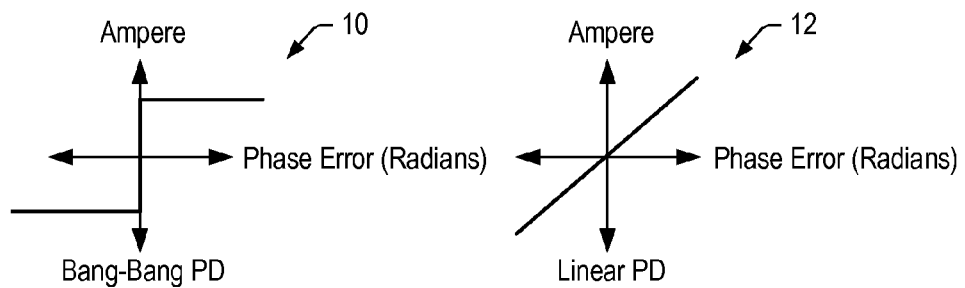
FIG. 1 is a graph of average current versus input phase error in non-linear and linear phase detectors.
Figure 2:
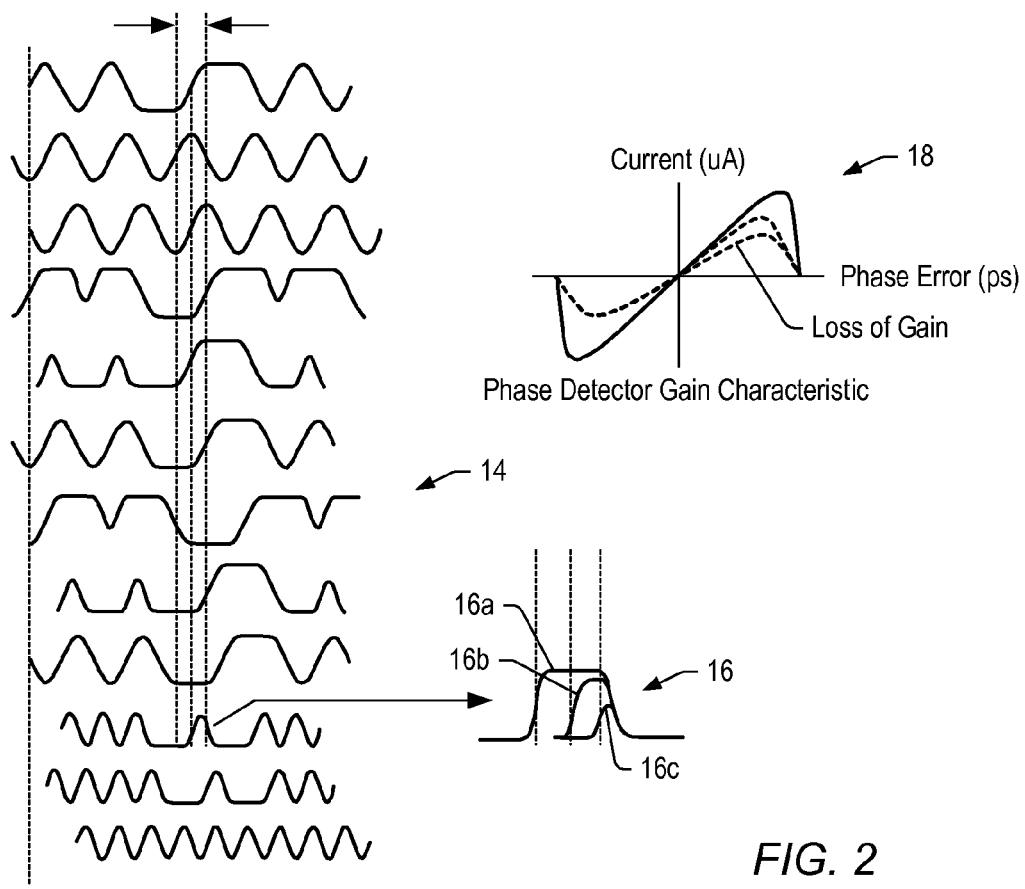
FIG. 2 is graph of high data-rate dependent gain errors causing non-linear loss of gain and a reduction of the linear range within a linear phase detector.
Figure 3:
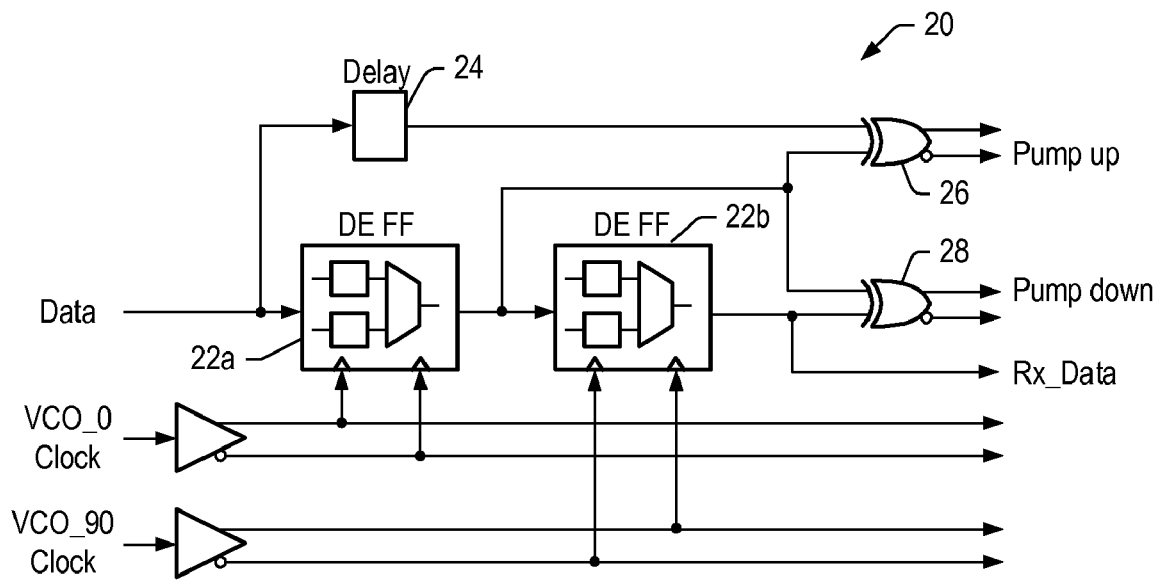
FIG. 3 is a block diagram of a partial clock recovery circuit that implements phase locking to a quadrature clocking signal from a data input.

Turning now to the drawings, FIG. 3 illustrates a linear phase detector 20 that uses a quadrature clocking signal that transitions at a frequency that does not exceed the frequency of the incoming data signal's maximum data rate. Phase detector 20 thereby receives the feedback quadrature clocking signal from the VCO in 0°, 90°, 180°, and 360° phase increments and places those clocking signals into a pair of double-edge flip-flops 22a and 22b. First flip-flop 22a is identical in architecture to second flip-flop 22b, except that flip-flop 22a receives data and flip-flop 22b receives the data delayed by flip-flop 22a. In addition to the clock delay within each flip-flop 22, a propagation delay within the first flip-flop 22a may require matching if the propagation delay becomes exceedingly large. A delay circuit 24 is used to match the clock-to-Q output (i.e., propagation delay) within first flip-flop 22a. The propagation-delayed incoming data stream and the first flip-flop output of the sampled incoming data stream are connected to a first logic gate 26. Likewise, the first flip-flop output of the sampled incoming data stream is connected to a second logic gate 28 along with a second flip-flop 22b, whose output represents a second or delayed sampling of the sampled output of the first flip-flop 22a, as shown.

The pump up output from first logic gate 26 can be a variable width pulse for each transition of the incoming data stream signal. The width of the pump up pulse will depend on the position of the differential pair of VCO_0 clock relative to the incoming data signal. The pump down signal, however, maintains a fixed pulse width dependent on the frequency of the VCO clock. The amount by which the variable width pump up signal exceeds or is less than the fixed, preferably 50% duty cycle pump down pulse, will dictate the amount by which phase detector 20 will cause the VCO to increase or decrease its frequency. Eventually, the quadrature clocking signal from VCO_0 and VCO_90 will match in phase relative with the incoming data stream. Importantly, however, flip-flops 22 will sample the incoming data stream on both edges of that data stream.

Figure 4:
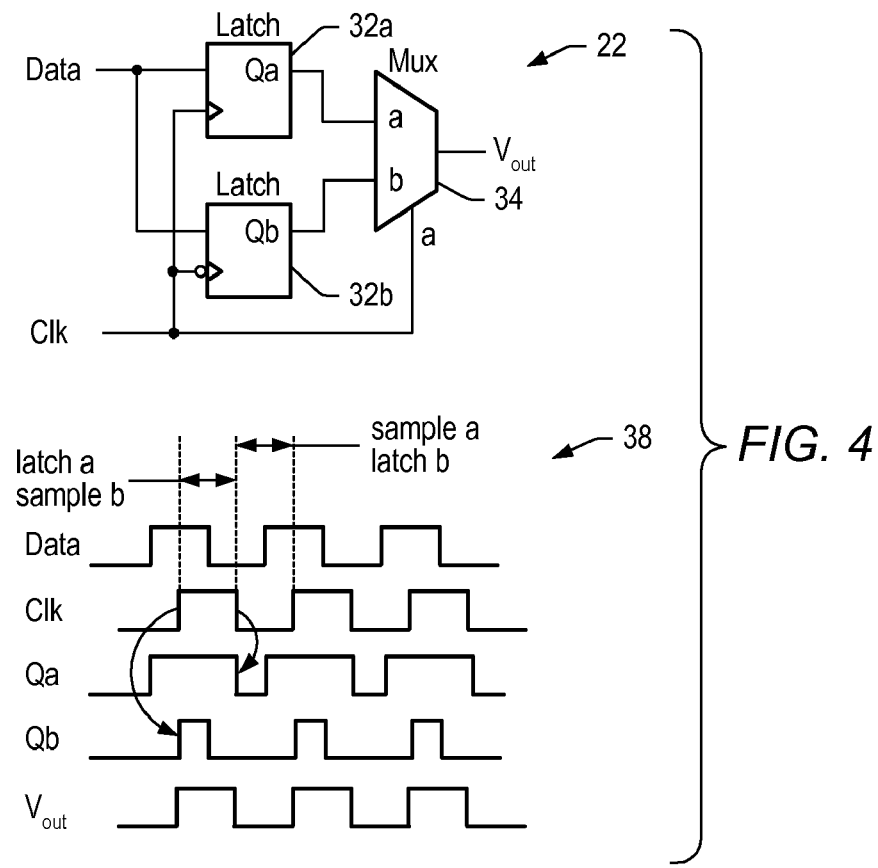
FIG. 4 is a block and timing diagram of a double-edge flip-flop of FIG. 3.

FIG. 4 illustrates in more detail the first or second flip-flop 22. Each flip-flop (regardless of whether it is the flip-flop 22a or the second flip-flop 22b) includes a pair of latches 32a and 32b whose outputs are selectable by a multiplexer 34. The clocking signal connected to the pair of latches 32 is a differential pair of clocking signals, either referenced to a 0° phase or a 90° phase. Details of flip-flop 22 operation are shown in timing diagram 38. It is important to recognize that the incoming data stream can be single-ended or differential, yet is preferably differential to match the differential clocking signal connected to each pair of flip-flops 22. For sake of simplicity, an example detailing only a single-ended timing diagram is provided in FIG. 4. First and second latches 32 use the clocking signal to alternately sample and latch each data pulse transition in an interleaving manner since, indeed, the clocking source is a differential clocking signal. Output from first latch 32a will sample the data beginning and ending at the falling and rising edge of the clock respectively. Output from first latch 32a will latch the data beginning and ending at rising and falling edges of the clock respectively. However, output from second latch 32b will sample the data beginning and ending at the rising and falling edges of the clock, respectively. Finally, output from second latch 32b will latch the data beginning and ending at falling and rising edges of the clock respectively, as shown.

Output from latches 32 can be selected by the clocking signal using multiplexer 34. Importantly, multiplexer 34 can use the clock input to select, or "sample," the output from the first latch, in the example shown. In effect, multiplexer 34 produces a series of pulse outputs ($V_{out}$) having a variable pulse width dependent on the timed phase relationship between the differential clocking inputs and the incoming differential data bit stream. The transitions of the clocking signal are placed between transitions of the data signal. If the clocking signal becomes slightly advanced or retarded, relative to the data input, the duty cycle on the output from multiplexer 34 does not change. However, the phase relationship between that output and the incoming data stream will change, much like the clock-to-Q delay in a typical flip-flop sampling circuit.

Figure 5:
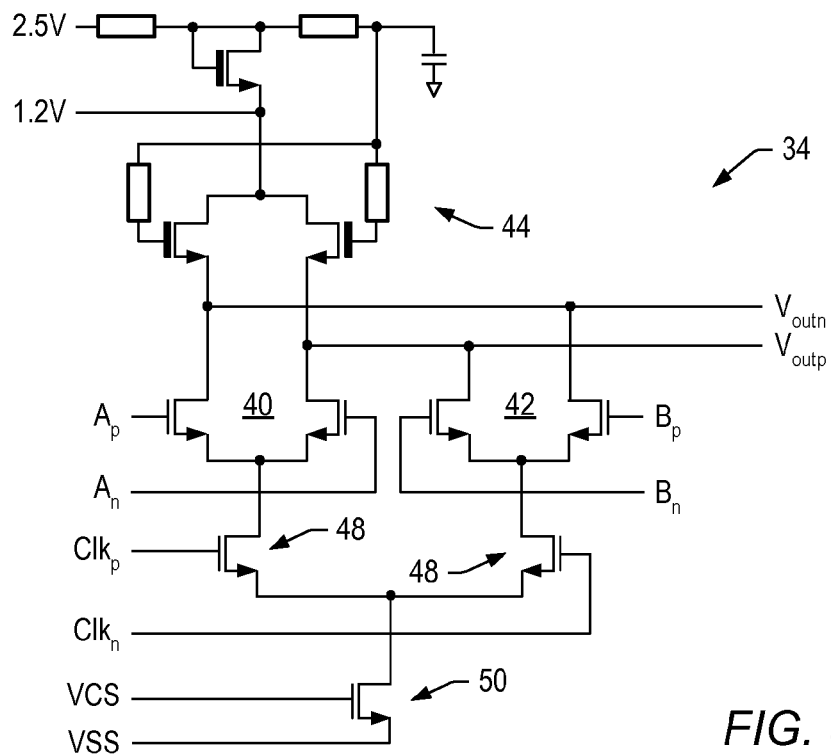
FIG. 5 is a block diagram of an exclusive OR multiplexer of FIG. 3.

FIG. 5 illustrates in further detail multiplexer 34. Specifically, multiplexer 34 is a differential multiplexer and, preferably, operates as an exclusive OR circuit. Multiplexer 34 includes a pair of differential amplifiers 40 and 42 as well as a load circuit 44. Load circuit 44 includes a pair of reference voltages and a resistor-capacitor network, wherein the resistors are shown as rectangles. In addition, load circuit 44 also includes three thick-gate NMOS transistors that are capable of operating with relatively higher gate voltages of 2.5V, compared to the nominal power supply voltage of 1.2V, for example. For this example circuit, the load circuit 44 can be viewed as an active load pair that ensures that the output voltage switches to a predefined level or state provided by the appropriate current-steering differential amplifiers 40 and 42. Inputs $A_P$ and $A_N$ are the differential inputs from, for example, the first latch 32a while the differential inputs $B_P$ and $B_N$ are from second latch 32b. Depending on the voltage-state of either the differential A inputs or differential B inputs, the selected transistor in the differential-switch pair 48 establishes a current path from transistor 50 to either differential pair 40 or 42. A constant current source transistor 50 can be used to control the magnitude of the bias current that is switched either to differential amplifier 40 or 42.

If, for example, input A is selected, then only one of the pair of amplifier-selecting transistors 48 will be on and the other off. In this instance, transistor 48 that connects to the common source of transistor pair 40 will be active. This allows the differential pair 40 to be on and the output voltage ($V_{outp}$–$V_{outn}$) will change state based upon the input signal ($A_p$–$A_n$). However, if input B is selected, transistor 48 that connects to the common source of transistor pair 42 will be active. This allows the differential pair 42 to be on and the output voltage ($V_{outp}$–$V_{outn}$) will change state based upon the input signal ($B_p$–$B_n$). The multiplexed timing is such that differential pairs 40 and 42 are on sequentially. For example, if the data pattern is a 50% duty cycle signal as shown in FIG. 4, then differential amplifiers 40 and 42 will turn on and drive the output load with a 180° phase difference. This will, for example, drive node voltage $V_{outn}$ to 1.2V while voltage node $V_{outp}$ is driven to a lower voltage. Likewise, node voltage $V_{outn}$ is then driven to a lower voltage while voltage node $V_{outp}$ is then driven to 1.2V. The voltage levels are relative to the power supply voltages detailed in FIG. 5 and are only included to show an example circuit for a given process technology. The resulting output differential signal ($V_{outp}$–$V_{outn}$) is repeated to produce a square wave of substantially equal duty cycles from multiplexer 34.

Figure 6:
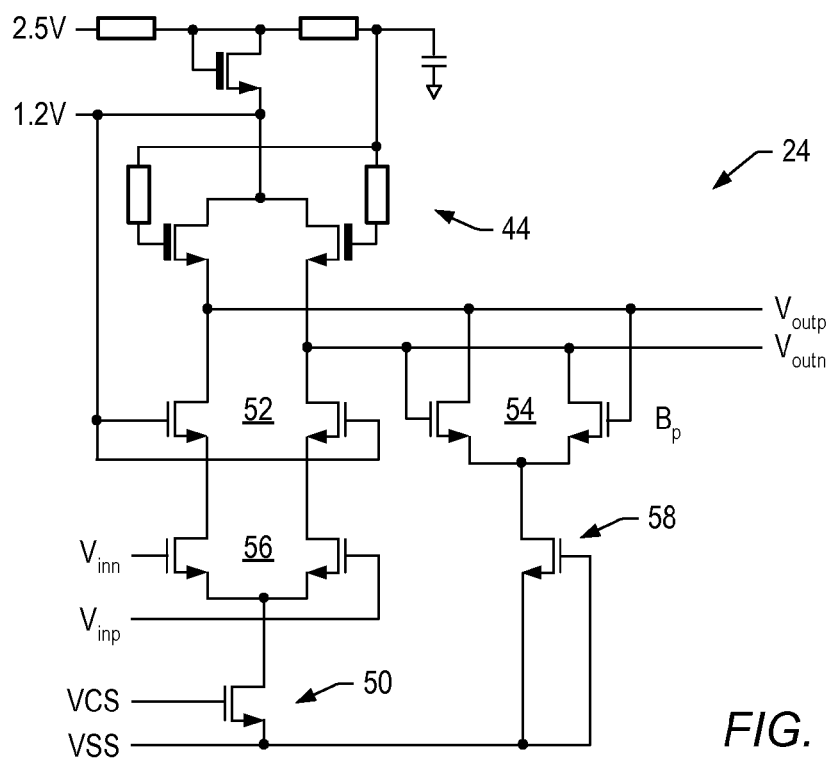
FIG. 6 is a block diagram of a delay cell of FIG. 3.
Figure 7:
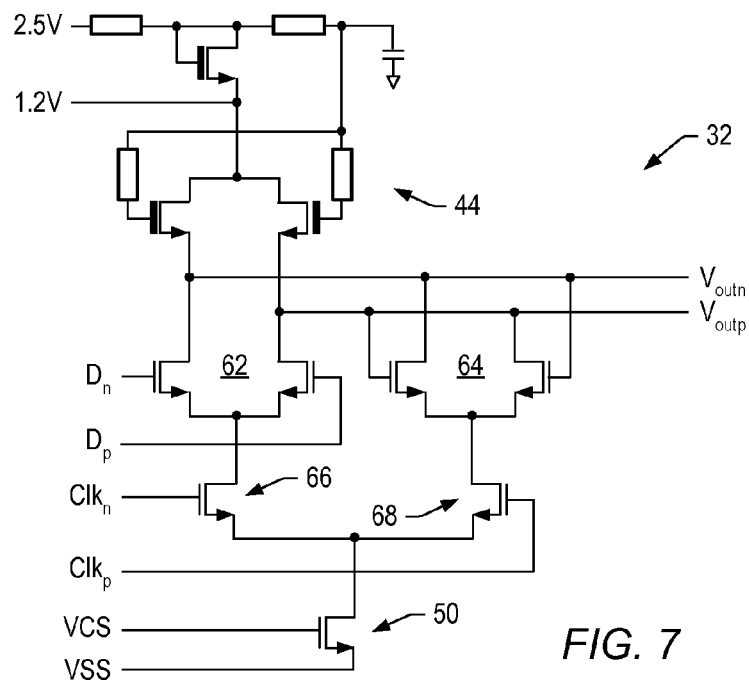
FIG. 7 is a block diagram of a latch of FIG. 3.

FIG. 6 illustrates in more detail the delay circuit 24. The goal of the differential delay circuit's structure is to represent an input-to-output delay path that matches the input-to-output (Clock to Q) delay of the differential latch circuit of FIG. 7 over process and temperature. Similar to the load circuit within multiplexer 34 (FIG. 5) and within the differential latch circuit cell (FIG. 7), delay circuit 24 includes active load circuit 44 having the same transistor, resistor, and capacitor values and characteristics as load circuit 44 in FIG. 5 and FIG. 7. In addition to load circuit 44, two pairs of stacked transistors 52 and 56 are shown to account for the clock-to-Q output delay time constant of the differential latch cell in FIG. 7. Transistors 62, and transistor 66 in FIG. 7 are similar to transistors 52 and transistors 56 in FIG. 6. It is important to note that either the clock input ($Clk_p$–$Clk_n$) in FIG. 7 or the data input ($Vin_p$–$Vin_n$) in FIG. 6 define when their respective outputs change state. The differential delay cell circuit uses cascode transistors 52, to switch the input voltage across transistor pair 56 to the output nodes $V_{outp}$ and $V_{outn}$. This is very similar to the differential clock input ($Clk_p$–$Clk_n$) of FIG. 7 changing state when the data inputs Dp and Dn are defined. In FIG. 6, transistor pair 54 and transistor 58 are not active and just represent dummy loads to account for circuit loading in a similar fashion as represented by transistor 64 to transistor 68 in FIG. 7.

Delay circuit 24 operates by receiving a differential data input signal ($V_{inn}$ and $V_{inp}$) and mimics or tracks the propagation delay between the clock input and the queue output of parallel-displaced latch circuits 32 (FIG. 4) of the first flip-flop 22a (FIG. 3). Specifically, the latch circuits have a pair of differential amplifiers, similar to the layout of differential amplifiers 52 and 54. By using the same transistor size, configuration, and layout within amplifier 52 and 54 as the latch cell amplifiers, the clock-to-queue propagation delay of latch cell can be replicated by delay cell 24 over all process variations for symmetrical phase detection pulse operation. Thus, the circuit structure of delay circuit 24 closely resembles that of the latch within the first flip-flop 22a to ensure the output from the first flip-flop arrives with the same transport delay as the output from delay circuit 24. Thus the relative time difference of both signals are not disturbed as they propagate via different paths to drive the pump up logic gate 26 (FIG. 3) with edge transitions occurring at different times.

FIG. 7 illustrates in more detail the differential latch circuit 32. Latch circuit 32, regardless of whether it is the first latch 32a or the second latch 32b (FIG. 4), includes a load circuit 44 similar to the load circuits within multiplexer 34 and delay circuit 24. Likewise, another pair of differential amplifiers 62 and 64 are provided. The first of which receives the incoming data bit stream differentially placed upon amplifier 62. The first pair of differential clocking signals within the quadrature-clocking signal activates in sequence amplifiers 62 and 64. When amplifier 62 is activated with clock input $Clk_n$ being differentially greater than clock input $Clk_p$, the latch cell is in the input data-sampling mode. In other words, when transistor pair 62 is active, the input voltage data ($D_P$–$D_N$) across the amplifier is transmitted to the output. When the differential clock input changes state with $Clk_p$ being differentially greater than $Clk_n$, transistor pair 64 is active and subsequent changes at the data input $D_p$ or $D_n$ are locked out. Transistor pair 64 is configured as a positive feedback circuit or local latch that freezes the state of the voltages on the output nodes thus putting the overall differential latch circuit 32 in the latch or hold-mode of operation.

The differential outputs ($V_{outp}$ and $V_{outn}$) from latch circuit 32 are presented as a final latched value and the second clocking pulse (i.e., $C_{lkp}$) arrives as a logic high voltage value. Therefore, the first clocking pulse will latch the leading edges of the incoming data bit stream, and the second clock (phase shifted by 180°) will latch the trailing edges of the incoming data bit stream. In other words, when $C_{lkp}$ goes high and $C_{lkn}$ goes low, the data bit stream is latched, as shown in timing diagram 38 of FIG. 4.

Figure 8:
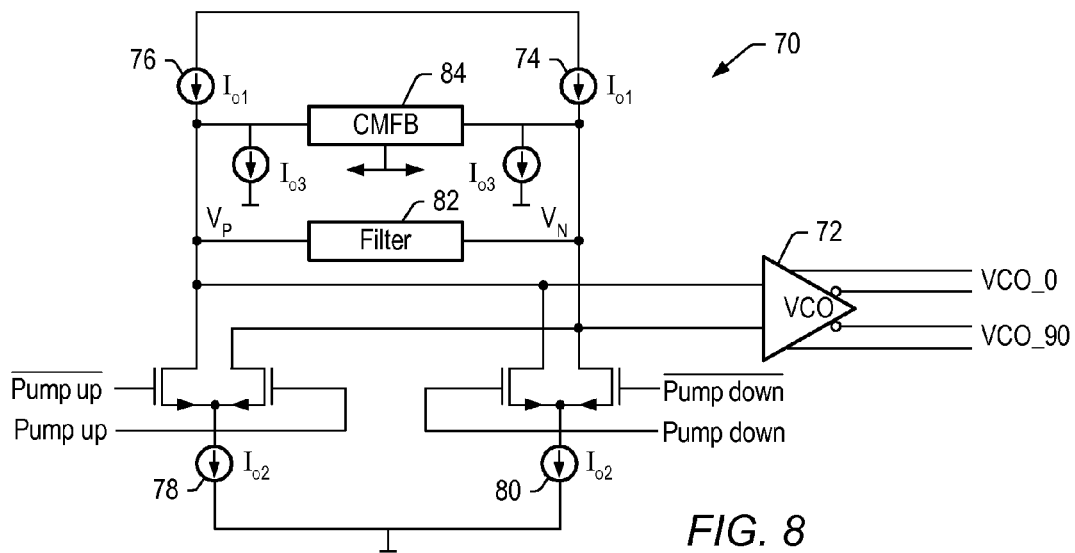
FIG. 8 is a block diagram of a charge pump and voltage controlled oscillator coupled to receive differential pump_up and pump_down signals from the clock recovery circuit of FIG. 3.

FIG. 8 illustrates a charge pump 70 whose output drives a voltage-controlled oscillator 72. FIG. 8 is presented to illustrate various other components within a PLL. Bias currents 76, 74, 78, 80 as well as $I_{o3}$ remain active and biased to proper operating levels. The bias current summation of $I_{o2}$ plus $I_{o3}$ equals the bias current value of $I_{o1}$. Current sources 76 and 74 represent PMOS transistors while current sources $I_{o2}$ and $I_{o3}$ represent NMOS transistors, with the total dc current value of this section always being constant. Charge pump 70 receives the differential pump up and pump down signals from the phase detector. The pump up and pump down signals control branch current paths that enable a loop filter to integrate these currents if desired. In essence, charge pump 70 includes a plurality of current sources that are switched through charge pump 70 depending on the pump up and pump down status. If the pump up duration exceeds the pump down duration, then the differential current will increase through the loop filter (a passive network) from left to right. Thus, when the bias current path for 76 is re-directed through the loop filter this condition will increase the node voltage $V_p$ and decrease voltage node $V_n$. Likewise, if the pump down duration exceeds the pump up duration, then the differential current will increase through the loop filter (a passive network) from right to left. Thus, when the bias current path for 74 is re-directed through the loop filter this condition will increase the node voltage $V_n$ and decrease voltage node $V_p$. When the average pump_up and pump_dn signals are equal in duration then the average current sourced or sunk through the loop filter will equal zero on average. However, if the average pump_up or pump_dn signals are not equal in duration then the charge pump will cause a bridging effect that will essentially apply a biasing charge to various low-pass capacitor-resistor filtering elements within filter 82.

The common mode feedback ("CMFB") device 84 ensures the common mode voltages on the outputs from charge pump 70 are theoretically equal while allowing differential voltage differences to be stored across the loop filter due to the possible differential charge supplied through the bridging operation. Thus, the duration of the difference between the longer pump up pulses versus the pump down pulses will cause a differential current between the outputs that are stored by the low-filter element 82 in the form of a voltage. If the relative duration differences are excessive, then the voltage differences will also increase or decrease accordingly. However, if the duration becomes fairly insignificant, so will the time varying voltages differences between the charge pump outputs. Note that the final voltage difference between the charge pump outputs across the loop filter does not have to equal 0 as long as their final value is static. The low-pass filter element 82 and the CMFB unit 84 can thereby suffice as a built-in integrator and low-pass filter which averages the voltage differential to account for continuous feedback operation according to a phase-locked loop design and control system theory.

Differential output voltage from charge pump 70 is sensed by the voltage-controlled oscillator ("VCO") 72. The VCO produces a quadrature clocking signal representing two pairs of differential clocking signals. The first pair (VCO_0) is advanced 90° relative to the second differential pair (VCO_90). There are various ways in which to implement a quadrature VCO output. One way might be to implement a multi-phase ring oscillator with taps separated by 90°. Another way might be to use a pair of coupled differential tuned-tank LC oscillators that through feedback techniques ensures that both oscillator phases are within 90° of alignment in time. Whatever architecture is used, however, each signal of the quadrature clocking signal transitions at a rate which does not exceed the maximum transition rate of the incoming data stream.

Thus, while the VCO design implements a quadrature output incorporating, for example, a ring or two tuned-tanks that function in parallel, the overall VCO design will be easier to implement and maintain stable operation due to its relatively lower frequency requirement. Using a pair of coupled tuned-tank oscillators for the VCO configuration running at half the conventional data rate (5 Ghz) allows for one to use a CMOS fabrication process to design a linear charge pump and linear phase detector to function at data rates exceeding 10 Gbit/sec. Moreover, the commuting signals needed to drive the charge pump are at a lower rate while giving additional design margin to the phase detector and charge pump design.

Figure 9:
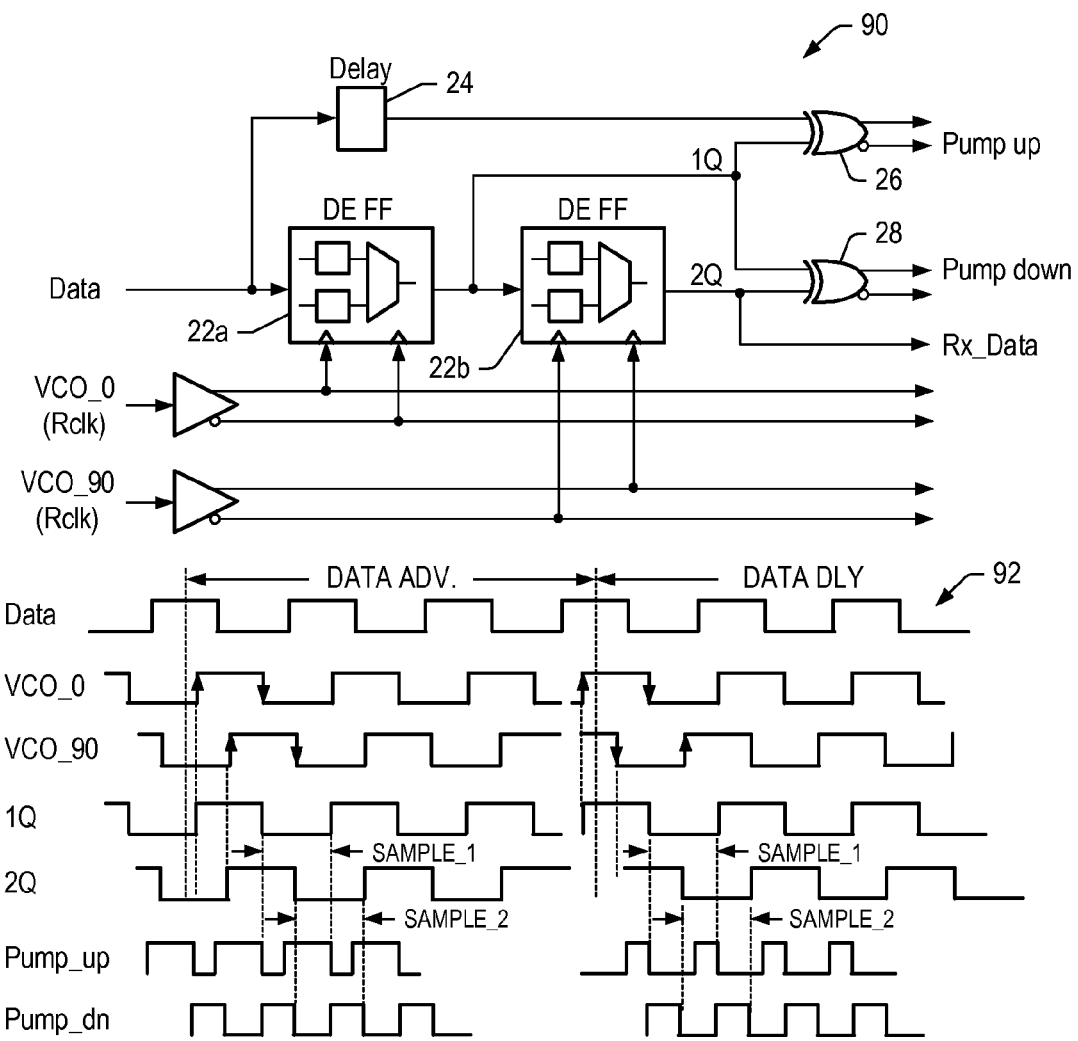
FIG. 9 is a block diagram of the clock recovery circuit of FIG. 3 with a timing diagram showing the phase detector receiving a clocking signal at a frequency substantially equal to the data input frequency, according to one embodiment; and While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

FIG. 9 illustrates the clock recovery circuit 90 indicative of the phase detector mechanism 20 (FIG. 3), shown in operation by the half-rate timing diagram 92. The data rate shown can be twice the frequency of the incoming data signal (assuming each logic high and low value of the incoming signal conveys one bit of information). For example, a specified data rate of 10 Gbit/sec for an NRZ encoded signal implies that the maximum data transition frequency will equal 5 Ghz when transmitting a data pattern of alternating ones and zeros (i.e., 1 0 1 0 1 0 1 0 1 . . . ). The various components in FIG. 9 are labeled similar to that of FIG. 3. However, timing diagram 92 indicates that a first tuned tank of the VCO produces an output clocking signal (VCO_0), whether inverted or not, that is at the same frequency as the maximum frequency of the incoming data signal. Likewise, the second tuned tank produces a delayed clocking signal output (VCO_90) that is also at the same frequency as the maximum frequency of the incoming data signal. The first differential pair of clocking signals is advanced 90° relative to the second differential pair and, when placed into the first and second flip-flops 22, produces outputs 1Q and 2Q, as shown.

Latches preceding the multiplexer within first and second flip-flops 22 sample and latch the corresponding data within first and second flip-flops 22 sampling the data. Thus, for example, VCO_0 samples and latches the value of the data stream in the middle of the data bit cell window, as shown by SAMPLE_1. SAMPLE_1 may indicate either a high or low state at the output of 1Q defined by the positive or negative edge of VCO_0 and the input data level, as flip-flop 22a is operating as a double-edged flip-flop. Clocking signal VCO_90 will sample and latch the delayed incoming data stream at node 1Q by driving the latch pair and the multiplexer of the second flip-flop 22b thereby defining the delayed data bit stream at SAMPLE_2. SAMPLE_2 may indicate either a high or low state at the output of 2Q defined by the positive or negative edge of VCO_90 and the SAMPLE_1 (1Q) input level, as flip-flop 22b is operating as a double-edged flip-flop. Exclusive OR gate 26 will compare the incoming data stream to the delayed data stream 1Q and will produce a pump up signal whenever the incoming data stream and the delayed data stream pulses are of dissimilar logic value, as shown. This will produce a pump up signal that has a longer logic 1 voltage value than a logic 0 voltage value for each cycle of the pump up signal. The pump down signal will have a fixed duty cycle and is not dependent on phase changes of the incoming data bit stream to the clocking phase. The pump down signal is dependent only on the delayed data signal 1Q further delayed at output 2Q, each of which are clocked by the same phase-oriented clocking signal; thereby, a fixed 50% duty cycle will always occur on the pump down signal.

As shown by timing diagram 92, if the data is advanced relative to the quadrature clocking signal, then the pump up signal will present a greater than 50% duty cycle. When compared to the pump down signal, charge pump 70 (FIG. 8) will increase the differential control voltage within VCO 72 (FIG. 8) to cause a corresponding phase advance of the VCO_0 and VCO_90 outputs so that, eventually, the VCO_0 clock transition will exist between the leading and trailing edges of the data pulse (i.e., within the "eye" opening). When the leading edge of the clock is centered properly, the width of the variable pump up pulse will be identical to the width of the fixed pump down pulse. As shown in timing diagram 92, if the data is delayed relative to VCO_0, then the pump up pulse will have less than 50% duty cycle thereby causing the charge pump to decrease its differential output, and the VCO output to retard the quadrature clocking signal VCO_0. In all instances, however, VCO_90 is maintained 90° phase retarded from VCO_0.

It is important to note that, if desired, the minimum number of flip-flops is two. More than two flip-flops can be connected in series to effectuate the phase detector architecture if, for example, a tri-wave configuration is needed. Tri-wave output from each of possibly three flip-flops can be forwarded to corresponding three exclusive OR gates such that when the output from the exclusive OR gates are integrated, average DC skewing on the output of the integrator will be virtually eliminated. The outputs from one or more of the exclusive OR gates of a three flip-flop configuration can be weighted to ensure a tri-wave occurs and that the overall area of the integrator output is maintained at zero to reduce data dependent jitter. The use of two flip-flops in series is, therefore, shown as merely an example of possibly numerous configurations of series-connected flip-flops and corresponding logic gates.

The present approach enables a large portion of the clock recovery system to run half as fast as conventional clock recovery systems that utilize, if possible, a full-rate linear phase detector. This may or may not save power due to the requirement of an additional tuned-tank oscillator. However, this invention gives the designer the option of seriously considering a linear phase detector approach, which before was much harder if not impossible to implement. Also, a reduction in switching noise, and a definite improvement in system timing design margin is achievable. The quadrature clocking signal will make decisions in the phase detector on both positive and negative clock edges for each flip-flop due to the VCO clock running at a reduced rate relative to the transition rate of the maximum incoming data stream frequency. Each flip-flop utilizes two latches in cascade that drive a multiplexer. The improved phase detector design thereby enables a reduction by one-half of the VCO frequency, committing a linear phase detector to work at lower sampling speeds. The first dual-edge flip-flop recovers a clock by sampling the input data stream on both edges of the data stream, and the second dual-edge flip-flop uses an inverted VCO clock to sample the first flip-flop output and provide a fixed reference pulse that is used for phase error detection.

One skilled in the art would appreciate that, after reading this disclosure, the phase detector, charge pump, VCO, other PLL circuitry, and clock recovery circuitry can be derived using slightly different architectures and schematics than those shown provided, of course, the outcome is consistent with that which is described herein. Accordingly, the specification and drawings are to be regarded in an illustrative rather than a restrictive sense as to possibly numerous variations that fall within the spirit and scope of the present embodiments.

What is claimed is:

1. A phase detector, comprising:
    a first flip flop coupled to receive an incoming signal and a differential first pair of clocking signals;
    a second flip flop coupled to receive a delayed said incoming signal and a differential second pair of clocking signals delayed 90° from the first pair of clocking signals;
    a first logic gate coupled to receive the incoming signal and an output from the first flip flop to produce a pump up signal; and
    a second logic gate coupled to receive the delayed said incoming signal and an output from the second flip flop to produce a pump down signal, wherein the pump down signal has a fixed duty cycle of 50 percent.

2. The phase detector as recited in claim 1, wherein the pump down signal has a fixed duty cycle of 50 percent regardless of phase differences between the incoming signal and the first pair of clocking signals.

3. The phase detector as recited in claim 1, wherein the pump up signal has a duty cycle that varies linearly with differences between phases of the incoming signal and the first pair of clocking signals.

4. The phase detector as recited in claim 3 wherein the pump up signal has a duty cycle that varies linearly for phase differences between approximately −180° and +180°.

5. The phase detector as recited in claim 1, wherein the differential first and second pairs of clocking signals transition at the same frequency not exceeding a frequency of the incoming signal or the delayed said incoming signal.

6. A method for producing charge pump signals, comprising:
    sampling rising and falling edges of an incoming signal using a quadrature clocking signal;
    generating a pump up signal having a duty cycle that changes linearly with phase differences between the incoming signal and the clocking signal; and
    generating a pump down signal having a 50 percent duty cycle that does not change linearly with phase differences between the incoming signal and the clocking signal.

7. The method as recited in claim 6, wherein said sampling comprises:
    first sampling the incoming signal with a first pair of differential said quadrature clocking signals; and
    second sampling a delayed said incoming signal with a second pair of differential said quadrature clocking signals delayed by 90° from the first pair of differential clocking signals.

8. The method as recited in claim 6, wherein said generating the pump up signal comprises comparing a variable said phase differences between the incoming signal and the clocking signal.

9. The method as recited in claim 6, wherein said generating the pump down signal comprises comparing a fixed said phase differences between a delayed said incoming signal and the clocking signal.

10. The method as recited in claim 6, further comprising advancing or retarding the quadrature clocking signal if the duty cycle of the pump up signal exceeds or is less than, respectively, the duty cycle of the pump down signal.

* * * * *